United States Patent
Park et al.

(10) Patent No.: US 8,513,669 B2
(45) Date of Patent: Aug. 20, 2013

(54) THIN FILM TRANSISTOR INCLUDING METAL OR METAL SILICIDE STRUCTURE IN CONTACT WITH SEMICONDUCTOR LAYER AND ORGANIC LIGHT EMITTING DIODE DISPLAY DEVICE HAVING THE THIN FILM TRANSISTOR

(75) Inventors: Byoung-Keon Park, Suwon-si (KR);
Jin-Wook Seo, Suwon-si (KR);
Tae-Hoon Yang, Suwon-si (KR);
Kil-Won Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 12/194,739

(22) Filed: Aug. 20, 2008

(65) Prior Publication Data
US 2009/0050894 A1   Feb. 26, 2009

(30) Foreign Application Priority Data
Aug. 22, 2007   (KR) ................ 10-2007-0084412

(51) Int. Cl.
*H01L 27/15*   (2006.01)
(52) U.S. Cl.
USPC .................................... 257/72; 257/E21.413
(58) Field of Classification Search
USPC .......... 257/72, 59, 257, 228, 294, 293, 291, 257/292, E21.413
See application file for complete search history.

(56) References Cited

U.S. PATENT DOCUMENTS

| | | | |
|---|---|---|---|
| 3,465,209 A | 9/1969 | Denning et al. | |
| 5,637,515 A * | 6/1997 | Takemura | 438/162 |
| 6,087,206 A | 7/2000 | Hamada | |
| 6,191,449 B1 | 2/2001 | Shino | |
| 6,380,007 B1 | 4/2002 | Koyama | |
| 6,399,460 B1 | 6/2002 | Yamaguchi et al. | |
| 6,495,857 B2 * | 12/2002 | Yamazaki | 257/59 |
| 6,500,704 B1 | 12/2002 | Hirano et al. | |
| 6,506,669 B1 * | 1/2003 | Kuramasu et al. | 438/586 |

(Continued)

FOREIGN PATENT DOCUMENTS

| CN | 1388591 A | 1/2003 |
|---|---|---|
| CN | 1638147 | 7/2005 |

(Continued)

OTHER PUBLICATIONS

Abstract of KR 2000-41547.

(Continued)

*Primary Examiner* — Bilkis Jahan
(74) *Attorney, Agent, or Firm* — H.C. Park & Associates, PLC

(57) ABSTRACT

A thin film transistor (TFT) includes a substrate, a semiconductor layer disposed on the substrate and including a channel region and source and drain regions, a gate electrode disposed in a position corresponding to the channel region of the semiconductor layer, a gate insulating layer interposed between the gate electrode and the semiconductor layer to electrically insulate the semiconductor layer from the gate electrode, a metal structure made up of metal layer, a metal silicide layer, or a double layer thereof disposed apart from the gate electrode over or under the semiconductor layer in a position corresponding to a region of the semiconductor layer other than a channel region, the structure being formed of the same material as the gate electrode, and source and drain electrodes electrically connected to the source and drain regions of the semiconductor layer.

11 Claims, 12 Drawing Sheets

(56) References Cited

U.S. PATENT DOCUMENTS

| | | | |
|---|---|---|---|
| 6,531,815 B1* | 3/2003 | Okuyama et al. | 313/506 |
| 6,620,661 B2 | 9/2003 | Maekawa et al. | |
| 6,746,905 B1 | 6/2004 | Fukuda | |
| 6,893,503 B1 | 5/2005 | Ohnuma et al. | |
| 7,045,444 B2 | 5/2006 | Yamazaki et al. | |
| 7,098,089 B2 | 8/2006 | Paik | |
| 7,130,002 B2 | 10/2006 | Seo et al. | |
| 7,202,143 B1 | 4/2007 | Naseem et al. | |
| 2001/0025992 A1 | 10/2001 | Nakajima et al. | |
| 2001/0041397 A1 | 11/2001 | Fukushima | |
| 2002/0013114 A1 | 1/2002 | Ohtani et al. | |
| 2002/0016029 A1 | 2/2002 | Kawakita et al. | |
| 2002/0096681 A1 | 7/2002 | Yamazaki et al. | |
| 2002/0182828 A1* | 12/2002 | Asami et al. | 438/485 |
| 2003/0013279 A1 | 1/2003 | Jang et al. | |
| 2003/0030108 A1 | 2/2003 | Morosawa | |
| 2003/0148561 A1 | 8/2003 | Nakajima | |
| 2003/0155572 A1 | 8/2003 | Han et al. | |
| 2003/0201442 A1 | 10/2003 | Makita | |
| 2004/0046171 A1* | 3/2004 | Lee et al. | 257/66 |
| 2004/0089878 A1* | 5/2004 | Takehashi et al. | 257/200 |
| 2004/0135180 A1 | 7/2004 | Makita | |
| 2004/0164300 A1 | 8/2004 | Yamazaki et al. | |
| 2004/0206958 A1* | 10/2004 | Yamazaki et al. | 257/59 |
| 2005/0035352 A1* | 2/2005 | Onizuka | 257/72 |
| 2005/0105037 A1 | 5/2005 | Kim et al. | |
| 2005/0110022 A1 | 5/2005 | Kim et al. | |
| 2005/0133867 A1 | 6/2005 | Ohtani et al. | |
| 2005/0140841 A1* | 6/2005 | Yang et al. | 349/43 |
| 2005/0170573 A1 | 8/2005 | Makita et al. | |
| 2005/0285111 A1 | 12/2005 | Tsuboi | |
| 2006/0033107 A1 | 2/2006 | Lee et al. | |
| 2006/0040438 A1 | 2/2006 | Lu et al. | |
| 2006/0115948 A1 | 6/2006 | Tokunaga | |
| 2006/0263957 A1 | 11/2006 | Wong et al. | |
| 2007/0007529 A1 | 1/2007 | Takemura et al. | |
| 2007/0181890 A1* | 8/2007 | Yamazaki et al. | 257/79 |
| 2007/0207577 A1 | 9/2007 | Oyu | |
| 2007/0228420 A1 | 10/2007 | Takano et al. | |
| 2008/0001228 A1 | 1/2008 | Shionoiri et al. | |
| 2008/0217620 A1 | 9/2008 | Park et al. | |
| 2008/0246027 A1 | 10/2008 | Kim | |
| 2009/0008642 A1 | 1/2009 | Kim et al. | |

FOREIGN PATENT DOCUMENTS

| | | |
|---|---|---|
| EP | 0 225 821 | 6/1987 |
| EP | 0 816 903 A1 | 1/1998 |
| EP | 1 052 700 | 11/2000 |
| EP | 1 508 921 A2 | 2/2005 |
| EP | 1 524 702 A2 | 4/2005 |
| EP | 1 858 068 | 11/2007 |
| EP | 2 003 695 | 12/2008 |
| EP | 2 009 680 | 12/2008 |
| EP | 2003695 | 12/2008 |
| EP | 2 028 687 | 2/2009 |
| EP | 2 107 613 | 10/2009 |
| JP | 62-104173 | 5/1987 |
| JP | 05-047791 | 2/1993 |
| JP | 06-151859 | 5/1994 |
| JP | 07-176753 | 7/1995 |
| JP | 07-326764 | 12/1995 |
| JP | 08-255907 | 10/1996 |
| JP | 10-012882 | 1/1998 |
| JP | 10-223533 | 8/1998 |
| JP | 10-242477 | 9/1998 |
| JP | 11-008393 | 1/1999 |
| JP | 11-111992 | 4/1999 |
| JP | 11-261075 | 9/1999 |
| JP | 2000-036598 | 2/2000 |
| JP | 2000-114527 | 4/2000 |
| JP | 2000-252474 | 9/2000 |
| JP | 2001-077364 | 3/2001 |
| JP | 2001-319878 | 11/2001 |
| JP | 2002-093745 | 3/2002 |
| JP | 2003-007719 | 1/2003 |
| JP | 2003-075870 | 3/2003 |
| JP | 2003-100633 | 4/2003 |
| JP | 2003-188098 | 7/2003 |
| JP | 2003-203924 | 7/2003 |
| JP | 2003-298059 | 10/2003 |
| JP | 2003-303831 | 10/2003 |
| JP | 2003-318194 | 11/2003 |
| JP | 2004-022845 | 1/2004 |
| JP | 2005-123565 | 5/2005 |
| JP | 2005-181973 | 7/2005 |
| JP | 2005-197526 | 7/2005 |
| JP | 2006-49823 | 2/2006 |
| JP | 2006-066860 | 3/2006 |
| JP | 2006-345003 | 12/2006 |
| JP | 2007-251149 | 9/2007 |
| KR | 1999-75412 | 10/1999 |
| KR | 1999-88504 | 12/1999 |
| KR | 2000-52006 | 8/2000 |
| KR | 2003-3043 | 1/2003 |
| KR | 2003-57656 | 7/2003 |
| KR | 2003-69779 | 8/2003 |
| KR | 2003-73075 | 9/2003 |
| KR | 2003-73076 | 9/2003 |
| KR | 2003-84738 | 11/2003 |
| KR | 2004-82168 | 9/2004 |
| KR | 10-482462 | 4/2005 |
| KR | 2005-36625 | 4/2005 |
| KR | 10-2005-0049684 | 5/2005 |
| KR | 10-2005-0049692 | 5/2005 |
| KR | 2005-41836 | 5/2005 |
| KR | 10-509529 | 8/2005 |
| KR | 2005-106244 | 11/2005 |
| KR | 2006-99694 | 9/2006 |
| KR | 10-2007-0024016 | 3/2007 |
| KR | 2008-0082827 | 9/2008 |

OTHER PUBLICATIONS

Office Action issued by Korean Intellectual Property Office in Korean Patent Application No. 10-2007-0053314 on Mar. 25, 2008.

Myers, S.M., et al. "Mechanisms of Transition-metal Gettering in Silicon", *Journal of Applied Physics*, V. 88, No. 7 (Oct. 1, 2000), pp. 3795-3819.

Benton, J.L. et al. "Behavior of Molybdenum in Silicon Evaluated for Integrated Circuit Processing", *Journal of Electrochemical Society*, V. 146, No. 5, (1999), pp. 1929-1933.

U.S. Appl. No. 12/405,466, filed Mar. 17, 2009, Byoung-Keon Park et al., Samsung Mobile Display Co., Ltd.

U.S. Appl. No. 12/409,085, filed Mar. 23, 2009, Byoung-Keon Park et al., Samsung Mobile Display Co., Ltd.

U.S. Appl. No. 12/199,232, filed Aug. 27, 2008, Yong-Chan You et al., Samsung SDI Co., Ltd.

Search Report issued by European Patent Office in European Patent Application No. 08157167.1 on Nov. 28, 2008.

Hu, Chen-Ming, et al. "Gettering of Nickel within Ni-Metal Induced Lateral Crystallization Polycrystalline Silicon Film through the Contact Holes". *Japanese Journal of Applied Physics*. Vo. 46, No. 48. 2007. pp. L1188-L1190.

Ng, K. K. *Complete Guide to Semiconductor Devices*. Second Edition. Wiley. New York. 2002. pp. 694-695.

European Search Report issued on Dec. 11, 2008 in corresponding European Application No. 08162758.0-1528.

Korean Notice of Allowability issued on Dec. 26, 2008 in corresponding Korean Application No. 2007-84934.

Korean Notice of Allowability issued on Dec. 26, 2008 in corresponding Korean Application No. 2007-84412.

Japanese Journal of Applied Physics; vol. 28, No. 7, pp. 1272-1273; 1989; XP009121147.

European Office Action issued on Aug. 11, 2009 in corresponding European Patent Application No. 08 157 16.1.

U.S. Appl. No. 12/502,413, filed Jul. 14, 2009, Byoung-Keon Park et al., Samsung Mobile Display Co., Ltd.

Fariborz Assaderaghi et al.: "Dynamic Threshold-Voltage MOSFET (DTMOS) for Ultra-Low Voltage VLSI" IEEE Transactions on Electron Devices, IEEE Service Center, Piscataway, NJ, US, vol. 44, No. 3, Mar. 1, 1997, XP011016082.

Office Action issued Aug. 28, 2009, in corresponding Chinese Patent Application No. 200810214019.
European Search Report issued Sep. 2, 2009 in corresponding European Application No. 09156279).
European Partial Search Report issued Sep. 4, 2009 in corresponding European Patent Application No. 09157829.
Final Office Action of U.S. Appl. No. 12/194,730 issued on May 4, 2011.
Final Office Action of U.S. Appl. No. 12/130,340 issued on May 12, 2011.
US Office Action dated Nov. 26, 2010, issued in corresponding U.S. Appl. No. 12/130,340.
US Office Action dated Dec. 9, 2010, issued in corresponding U.S. Appl. No. 12/194,730.
Non-Final Office Action dated Jun. 24, 2011 in U.S. Appl. No. 12/409,085.
Jones, et al., "Diffusivity of impurities in polysilicon", Feb. 21, 2007, XP009150765.
Non-Final Office Action issued on Sep. 30, 2011 in co-pending U.S. Appl. No. 12/502,413.
Non-Final Office Action issued on Sep. 21, 2011 in co-pending U.S. Appl. No. 12/405,466.
Non-Final Office Action issued on Oct. 7, 2011 in co-pending U.S. Appl. No. 12/130,340.
Notice of Allowance issued on Oct. 4, 2011 in co-pending U.S. Appl. No. 12/194,730.
Notice of Allowance issued on Oct. 17, 2011 in co-pending U.S. Appl. No. 12/409,085.
Final Office Action of U.S. Appl. No. 12/502,413, dated Feb. 16, 2012.
Notice of Allowance issued for related U.S. Appl. No. 12/194,730 dated Jun. 12, 2012.
Final Office Action of U.S. Appl. No. 12/405,466 dated Apr. 5, 2012.
Final Office Action of U.S. Appl. No. 12/130,340 dated Mar. 8, 2012.
Notice of Allowance issued for related U.S. Appl. No. 12/405,466 dated Aug. 8, 2012.
Notice of Allowance issued for related U.S. Appl. No. 13/333,587 dated Jan. 15, 2013.
Non-Final Office Action issued for related U.S. Appl. No. 13/464,579 dated Mar. 21, 2013.

* cited by examiner

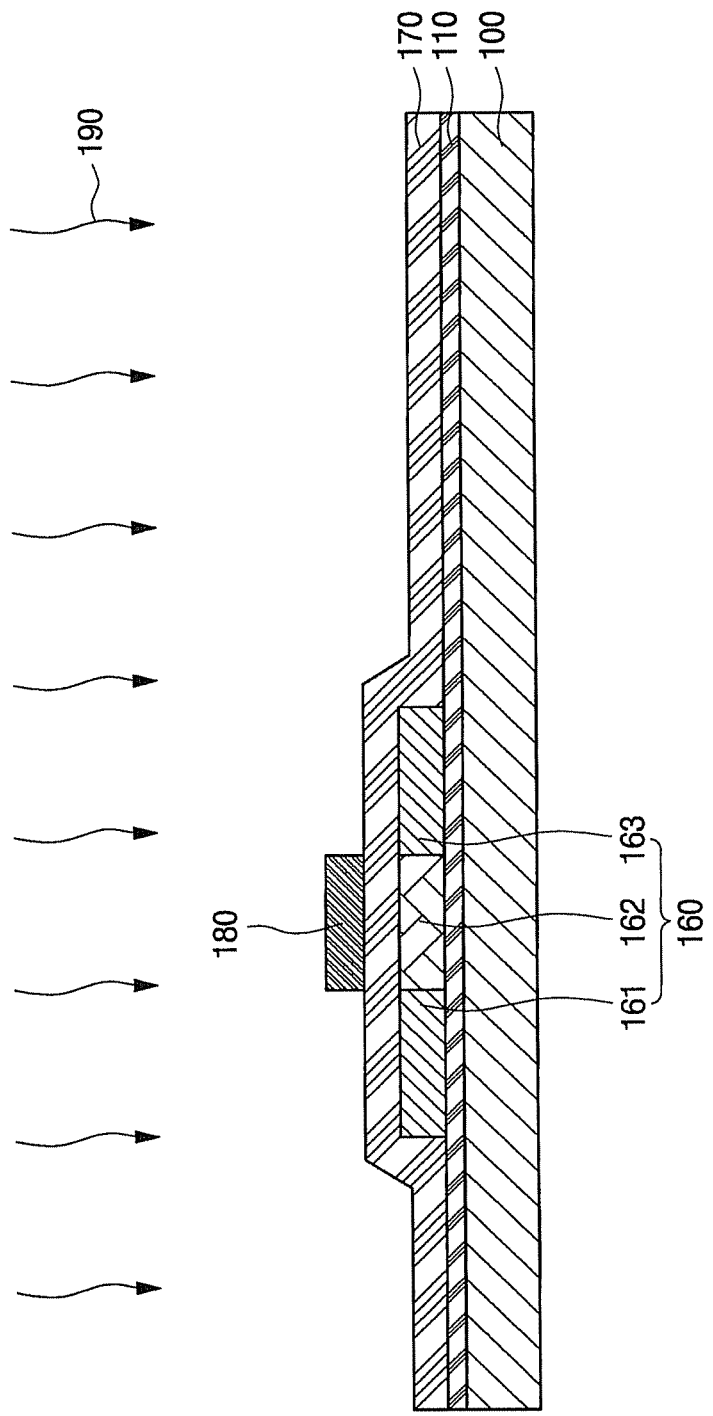

THIN FILM TRANSISTOR INCLUDING METAL OR METAL SILICIDE STRUCTURE IN CONTACT WITH SEMICONDUCTOR LAYER AND ORGANIC LIGHT EMITTING DIODE DISPLAY DEVICE HAVING THE THIN FILM TRANSISTOR

CROSS-REFERENCE TO RELATED APPLICATION

This application claims the benefit of Korean Application No. 2007-84412, filed Aug. 22, 2007 in the Korean Intellectual Property Office, the disclosure of which is incorporated herein by reference.

BACKGROUND OF THE INVENTION

1. Field of the Invention

Aspects of the present invention relate to a thin film transistor (TFT), a method of fabricating the TFT, an organic light emitting diode (OLED) display device having the TFT, and a method of fabricating the OLED display device. More particularly, aspects of the present invention relate to a TFT in which an amount of a crystallization-inducing metal remaining in a channel region of a semiconducting layer crystallized using the crystallization-inducing metal is reduced by gettering to improve the electrical properties of the TFT, a method of fabricating the TFT, an OLED display device having the TFT, and a method of fabricating the OLED display device.

2. Description of the Related Art

In general, a polycrystalline silicon (poly-Si) layer is widely used as a semiconductor layer for a thin film transistor (TFT) because the poly-Si has a high field-effect mobility, can be applied to a high-speed operating circuit, and can used to configure a complementary-metal-oxide-semiconductor (CMOS) circuit. A TFT using a poly-Si layer may be typically used as an active device of an active-matrix liquid crystal display (AMLCD) or a switching device or a driving device of an organic light emitting diode (OLED) display device.

Methods of crystallizing an a-Si layer into a poly-Si layer may include a solid phase crystallization (SPC) method, an excimer laser crystallization (ELC) method, a metal induced crystallization (MIC) method, and a metal induced lateral crystallization (MILC) method. Recently, a vast amount of research has been conducted on methods of crystallizing an a-Si layer using a crystallization-inducing metal, because these methods allow for a-Si layer to be crystallized at a lower temperature for a shorter amount of time than does an SPC method.

Typical methods of crystallizing an a-Si layer using a crystallization-inducing metal are a MIC method and a MILC method. In these methods, however, the device characteristics of a TFT may be degraded due to contamination caused by the crystallization-inducing metal.

In order to prevent the contamination caused by the crystallization-inducing metal, a gettering process may be performed after an a-Si layer is crystallized using the crystallization-inducing metal to remove the remaining crystallization-inducing metal. Conventionally, the gettering process is performed using impurities, such as phosphorus (P) gas or noble gas, or by forming an a-Si layer on a poly-Si layer. However, in the conventional methods, the crystallization-inducing metal may not be effectively removed from the poly-Si layer, so a leakage current may still be problem.

SUMMARY OF THE INVENTION

Aspects of the present invention provide a thin film transistor (TFT) in which an amount of a crystallization-inducing metal remaining in a channel region after forming a semiconductor layer using a crystallization-inducing metal is reduced by gettering the crystallization-inducing metal existing in the channel region to improve electrical properties of the TFT, a method of fabricating the TFT, an organic light emitting diode (OLED) display device having the TFT, and a method of fabricating the OLED display device.

According to an embodiment of the present invention, a TFT includes: a substrate; a semiconductor layer disposed on the substrate and including a channel region and source and drain regions; a gate electrode disposed in a position corresponding to the channel region of the semiconductor layer; a gate insulating layer interposed between the gate electrode and the semiconductor layer to electrically insulate the semiconductor layer from the gate electrode; a metal structure comprising a metal layer, a metal silicide layer, or a double layer thereof disposed apart from the gate electrode over or under the semiconductor layer in a position corresponding to a region of the semiconductor layer other than a channel region, the structure being formed of the same material as the gate electrode; and source and drain electrodes electrically connected to the source and drain regions of the semiconductor layer.

According to another embodiment of the present invention, a method of fabricating a TFT includes: providing a substrate; forming a crystallized semiconductor layer on the substrate using a crystallization-inducing metal; forming a gate electrode in a position corresponding to a channel region of the semiconductor layer; forming a gate insulating layer between the gate electrode and the semiconductor layer to electrically insulate the semiconductor layer from the gate electrode; forming a structure comprising a metal layer, a metal silicide layer, or a double layer thereof over or under the semiconductor layer in a position corresponding to a region of the semiconductor layer other than a channel region, the metal structure being formed of the same material as the gate electrode; and forming source and drain electrodes to be electrically connected to the source and drain regions of the semiconductor layer. In the method, the substrate on which the metal structure is formed is annealed to getter the crystallization-inducing metal from the channel region of the semiconductor layer into a region of the semiconductor layer corresponding to the metal structure.

According to still another embodiment of the present invention, an OLED display device includes: a substrate; a semiconductor layer disposed on the substrate and including a channel region and source and drain regions; a gate electrode disposed in a position corresponding to the channel region of the semiconductor layer; a gate insulating layer interposed between the gate electrode and the semiconductor layer to electrically insulate the semiconductor layer from the gate electrode; a metal structure comprising a metal layer, a metal silicide layer, or a double layer thereof disposed apart from the gate electrode over or under the semiconductor layer in a position corresponding to a region of the semiconductor layer other than a channel region, the metal structure being formed of the same material as the gate electrode; source and drain electrodes electrically connected to the source and drain regions of the semiconductor layer; a first electrode electrically connected to one of the source and drain electrodes; an organic layer disposed on the first electrode; and a second electrode disposed on the organic layer.

According to yet another embodiment of the present invention, a method of fabricating an OLED display device includes: providing a substrate; forming a crystallized semiconductor layer on the substrate using a crystallization-inducing metal; forming a gate electrode in a position corresponding to a channel region of the semiconductor layer; forming a gate insulating layer between the gate electrode and the semiconductor layer to electrically insulate the semiconductor layer from the gate electrode; forming a metal structure comprising a metal layer, a metal silicide layer, or a double layer thereof over or under the semiconductor layer in a position corresponding to a region of the semiconductor layer other than a channel region, the metal structure being formed of the same material as the gate electrode; and forming source and drain electrodes to be electrically connected to the source and drain regions of the semiconductor layer; forming a first electrode to be electrically connected to one of the source and drain electrodes; forming an organic layer having an emission layer (EML) on the first electrode; and forming a second electrode on the organic layer. In the method, the substrate on which the metal structure is formed is annealed to getter the crystallization-inducing metal from the channel region of the semiconductor layer into a region of the semiconductor layer corresponding to the metal structure.

According to another embodiment of the present invention, there is provided a method of fabricating a top gate thin film transistor, comprising forming a crystallized semiconductor layer on a substrate using a crystallization-inducing metal, the crystallized semiconductor layer comprising a channel region, a source region and a drain region; forming a gate insulating layer on the crystallized semiconductor layer; etching the gate insulating layer to form at least one first contact hole partially exposing a region of the semiconductor layer other than the channel region; depositing a gate electrode material on the gate insulating layer and filling the at least one first contact hole, wherein the gate electrode material comprises a metal, a metal silicide or a double layer or combination thereof; patterning the gate electrode material to form a gate electrode corresponding to the channel region and at least one metal structure separated from the gate electrode and comprising the gate electrode material filling the at least one first contact hole; and annealing the crystallized semiconductor layer having the gate electrode and at least one metal structure formed thereon such that crystallization-inducing metal remaining in the channel region of the crystallized semiconductor layer is gettered to a region of the semiconductor layer contacting the metal structure.

According to another embodiment of the present invention, there is provided a method of fabricating a bottom gate thin film transistor, comprising depositing a gate electrode material on a substrate, wherein the gate electrode material comprises a metal, a metal silicide or a double layer or combination thereof; patterning the gate electrode material to form a gate electrode and at least one metal structure separated from the gate electrode; forming a gate insulating layer on the substrate to cover the gate electrode and the at least one metal structure; etching the gate insulating layer to expose the at least one metal structure; forming an amorphous silicon layer on the gate insulating layer and contacting the at least one metal structure; crystallizing the amorphous silicon layer using a crystallization-inducing metal to form a polycrystalline silicon layer and patterning the polycrystalline silicon layer to form a semiconductor layer comprising a channel region aligned with the gate electrode, a source region and a drain region, wherein the semiconductor layer contacts the metal structure in a region outside the channel region; and annealing the crystallized semiconductor layer such that crystallization-inducing metal remaining in the channel region of the crystallized semiconductor layer is gettered to a region of the semiconductor layer contacting the metal structure.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 2A through 2F are cross-sectional views illustrating a method of fabricating a top-gate thin film transistor (TFT) according to an exemplary embodiment of the present invention;

DETAILED DESCRIPTION OF THE EMBODIMENTS

Figure 1A:
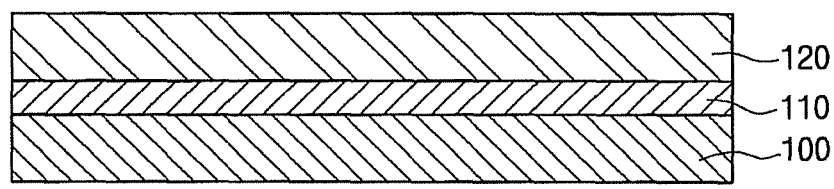
FIGS. 1A through 1D are cross-sectional views illustrating a crystallization process according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Herein, it is to be understood that where is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process.

FIGS. 1A through 1D are cross-sectional views illustrating a crystallization process according to an embodiment of the present invention.

Referring to FIG. 1A, a buffer layer 110 is formed on a substrate 100, such as a glass substrate or a plastic substrate. The buffer layer 110 may be obtained using a chemical vapor deposition (CVD) technique or a physical vapor deposition (PVD) technique. The buffer layer 110 may be a single or multiple layer formed of one or more insulating materials such silicon oxide or silicon nitride. In this case, the buffer layer 110 may prevent the diffusion of moisture or impurities generated in the substrate 100 or control the transmission rate of heat during a crystallization process, thereby facilitating the crystallization of an amorphous silicon (a-Si) layer.

Thereafter, an a-Si layer 120 is formed on the buffer layer 110. The a-Si layer 120 may be obtained using a CVD or PVD technique. Also, a dehydrogenation process may be performed during or after the formation of the a-Si layer 120, thereby lowering the concentration of hydrogen in the a-Si layer.

The a-Si layer 120 is then crystallized into a poly-Si layer. In the present embodiment, the a-Si layer 120 may be crystallized into the poly-Si layer by a crystallization method that uses a crystallization-inducing metal, such as a metal induced crystallization (MIC) method, a metal induced lateral crystallization (MILC) method, or a super grain silicon (SGS) crystallization method.

In the MIC method, a metal, such as nickel (Ni), palladium (Pd), gold (Au), or aluminum (Al), is brought into contact with or doped into an a-Si layer to induce a phase change of the a-Si layer into a poly-Si layer. In the MILC method, silicide formed by reaction of metal with silicon laterally diffuses so as to sequentially induce crystallization of an a-Si layer.

In the SGS crystallization method, a crystallization-inducing metal that diffuses into the a-Si layer is controlled to a low concentration such that the size of crystal grains ranges from several to several hundred μm. For example, the SGS crystallization method may include forming a capping layer to control diffusion of a crystallization-inducing metal on the a-Si layer, forming a crystallization-inducing metal layer on the capping layer, and annealing the crystallization-inducing metal layer to diffuse a crystallization-inducing metal into the a-Si layer, thereby crystallizing the a-Si layer into a poly-Si layer. Alternatively, the concentration of a crystallization-inducing metal that diffuses into an a-Si layer may be lowered by forming a crystallization-inducing metal layer at a low concentration without forming a capping layer.

According to the SGS crystallization method using a capping layer, the concentration of a crystallization-inducing metal that diffuses into an a-Si layer is controlled more effectively than in the MIC or MILC method. Thus, the SGS crystallization method will now be described.

Figure 1B:
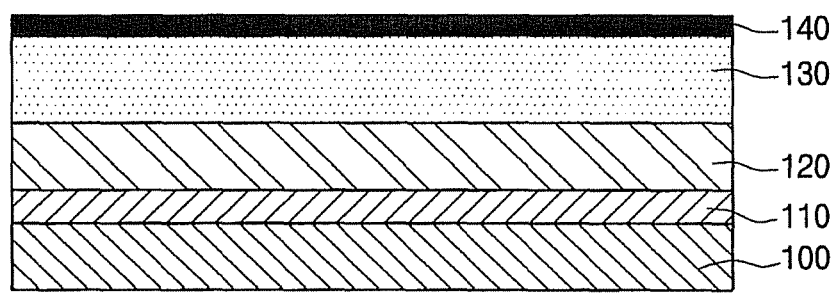

FIG. 1B is a cross-sectional view illustrating a process of forming a capping layer and a crystallization-inducing metal layer on the a-Si layer. Referring to FIG. 1B, a capping layer 130 is formed on the a-Si layer 120. The capping layer 130 may be a silicon nitride layer into which a crystallization-inducing metal may diffuse during a subsequent annealing process or a double layer of a silicon nitride layer and a silicon oxide layer. The capping layer 130 may be formed using a deposition method such as CVD or PVD. The capping layer 130 may be formed to a thickness of about 1 to 2000 Å. When the capping layer 130 is formed to a thickness of less than 1 Å, the capping layer 130 may not properly function to control the amount of crystallization-inducing metal that diffuses into the a-Si layer 120. When the capping layer 130 is formed to a thickness of more than 2000 Å, only a small amount of crystallization-inducing metal diffuses into the a-Si layer 120, thereby resulting in incomplete crystallization of the a-Si layer 120.

Thereafter, a crystallization-inducing metal is deposited on the capping layer 130, thereby forming a crystallization-inducing metal layer 140. The crystallization-inducing metal may be one selected from the group consisting of Ni, Pd, Ag, Au, Al, Sn, Sb, Cu, Tr, and Cd. For example, the crystallization-inducing metal may be Ni. In this case, the crystallization-inducing metal layer 140 may be formed to an areal density of about $10^{11}$ to $10^{15}$ atoms/cm$^2$ on the capping layer 130. When the crystallization-inducing metal layer 140 is formed to an areal density lower than about $10^{11}$ atoms/cm$^2$, only a small number of seeds are formed, thereby precluding crystallization of the a-Si layer 120 into a poly-Si layer. When the crystallization-inducing metal layer 140 is formed to an areal density of more than about $10^{15}$ atoms/cm$^2$, the amount of crystallization-inducing metal diffusing into the a-Si layer 120 is increased, thereby reducing the size of crystal grains of the poly-Si layer. Also, the amount of the remaining crystallization-inducing metal is increased so that the characteristics of a semiconductor layer formed by patterning the poly-Si layer may be degraded.

When the capping layer 130 is formed as in the present embodiment, it is not necessary to precisely control the thickness of the crystallization-inducing metal layer 140 since the capping layer 130 controls the diffusion of the crystallization-inducing metal such that only a very small amount of crystallization-inducing metal diffuses into the a-Si layer 120 to enable the crystallization of the a-Si layer 120.

Figure 1C:
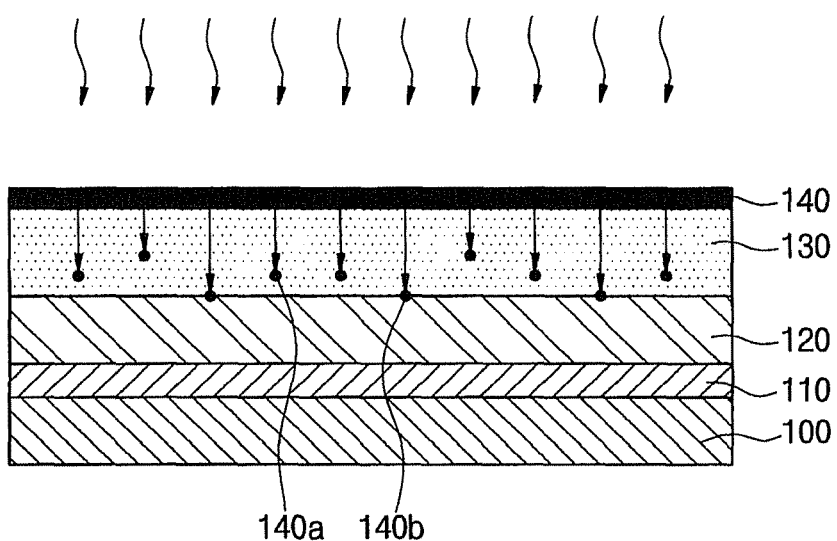

FIG. 1C is a cross-sectional view illustrating a process of annealing the substrate to diffuse the crystallization-inducing metal through the capping layer into the a-Si layer. Referring to FIG. 1C, the substrate 100 having the buffer layer 110, the a-Si layer 120, the capping layer 130, and the crystallization-inducing metal layer 140 is annealed so that some of the crystallization-inducing metal of the crystallization-inducing metal layer 140 diffuses to the surface of the a-Si layer 120. Specifically, only a small amount of the crystallization-inducing metal 140b out of crystallization-inducing metals 140a and 140b diffusing through the capping layer 130 diffuses all the way onto the surface of the a-Si layer 120, while a large amount of crystallization-inducing metal 140a neither reaches the a-Si layer 120 nor passes through the capping layer 130.

Thus, the amount of crystallization-inducing metal that diffuses to the surface of the a-Si layer 120 may depend on the diffusion barrier capability of the capping layer 130, which is closely related to the thickness of the capping layer 130. In other words, as the thickness of the capping layer 130 increases, the diffused amount of crystallization-inducing metal decreases and the size of crystal grains increases. Conversely, as the thickness of the capping layer 130 decreases, the diffused amount of crystallization-inducing metal increases and the size of the crystal grains decreases.

In this case, the annealing process to diffuse the crystallization-inducing metal may be performed at a temperature of about 200 to 900° C. for several seconds to several hours. When the annealing process is performed under the above-described time and temperature conditions, deformation of the substrate 100 due to overheating may be prevented, and desired results may be obtained in terms of fabrication cost and yield. The annealing process may be performed using any one of a furnace process, a rapid thermal annealing (RTA) process, an ultraviolet (UV) process, and a laser process.

Figure 1D:
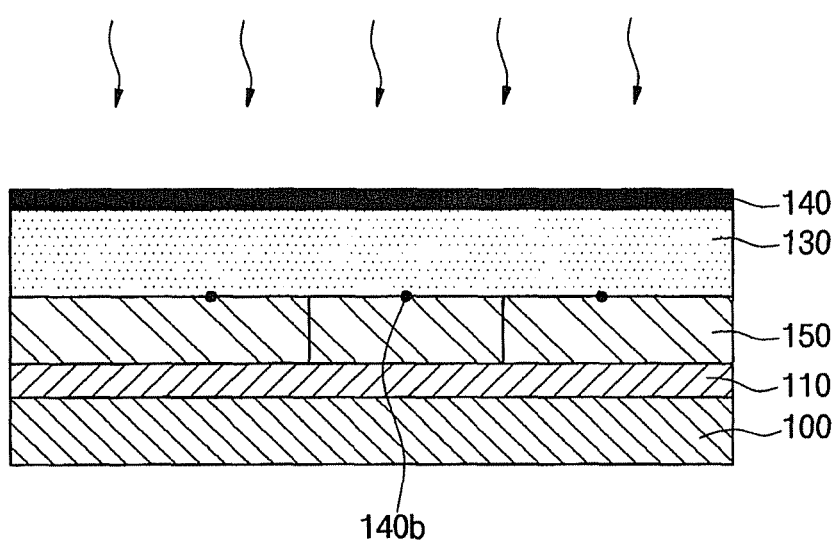

FIG. 1D is a cross-sectional view illustrating a process of crystallizing the a-Si layer into a poly-Si layer using the diffused crystallization-inducing metal. Referring to FIG. 1D, the a-Si layer 120 is crystallized into a poly-Si layer 150 as catalyzed by the crystallization-inducing metal 140b that passes through the capping layer 130 and diffuses into the surface of the a-Si layer 120. That is, the diffused crystallization-inducing metal 140b combines with Si of the a-Si layer 120 to form a metal silicide. The metal silicide forms crystal nuclei (i.e., seeds), thereby crystallizing the a-Si layer 120 into the poly-Si layer 150.

Accordingly, the number of seeds formed by the metal silicide, that is, the amount of diffused crystallization-inducing metal 140b that contributes toward crystallizing the a-Si layer 120, is controlled such that the size of crystal grains of the poly-Si layer 150 may range from several to several hundred μm. Also, since only a very small amount of crystallization-inducing metal remains in the poly-Si layer 150 due to the diffusion inhibiting effects of the capping layer 130, the poly-Si layer 150 exhibits better characteristics than layers formed by other crystallization methods.

Although it is illustrated in FIG. 1D that the annealing process is performed on the resultant structure having the capping layer 130 and the crystallization-inducing metal layer 140, after the crystallization-inducing metal is diffused into the surface of the a-Si layer 120 to form the metal silicide, the capping layer 130 and the crystallization-inducing metal layer 140 may be removed before the annealing process for forming the poly-Si layer 150 is performed.

FIGS. 2A through 2F are cross-sectional views illustrating a process of fabricating a top-gate TFT according to an exemplary embodiment of the present invention.

Figure 2A:
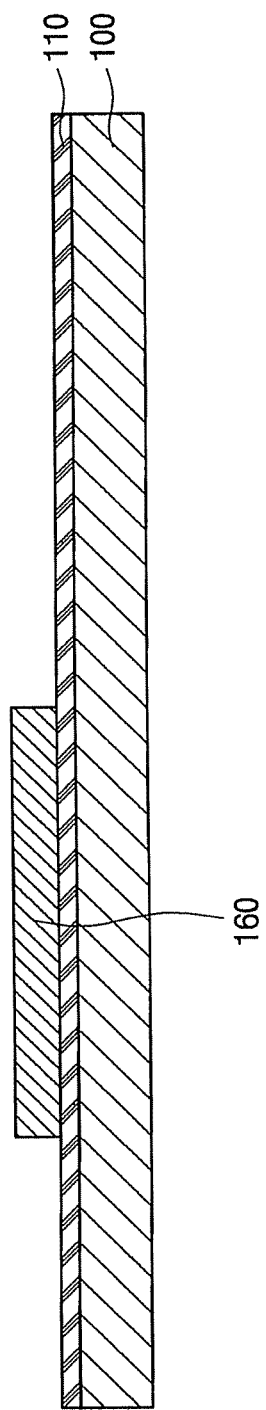

Referring to FIG. 2A, a poly-Si layer 150, which is formed using the SGS crystallization method described with reference to FIGS. 1A through 1D, is patterned, thereby forming a semiconductor layer 160 on the substrate 100 (refer to FIG. 1A) having the buffer layer 110 (refer to FIG. 1A). As an alternative, the poly-Si layer 150 may be patterned during a subsequent process.

Referring to FIG. 2B, a gate insulating layer 170 is formed on the substrate 100 having the semiconductor layer 160. The gate insulating layer 170 may be a silicon oxide layer, a silicon nitride layer, or a double layer thereof.

A photoresist pattern 180 is formed on the gate insulating layer 170 to correspond to a region where a channel region of the semiconductor layer 160 will be defined. Thereafter, conductive impurity ions 190 may be doped using the photoresist pattern 180 as a mask, thereby forming a source region 161, a drain region 163, and a channel region 162. In this case, the impurity ions 190 may be p-type impurity ions or n-type impurity ions. The p-type ions may be ions of one selected from the group consisting of boron (B), aluminum (Al), gallium (Ga), and indium (In), and the n-type ions may be ions of one selected from the group consisting of phosphorus (P), arsenic (As), and antimony (Sb).

Figure 2C:
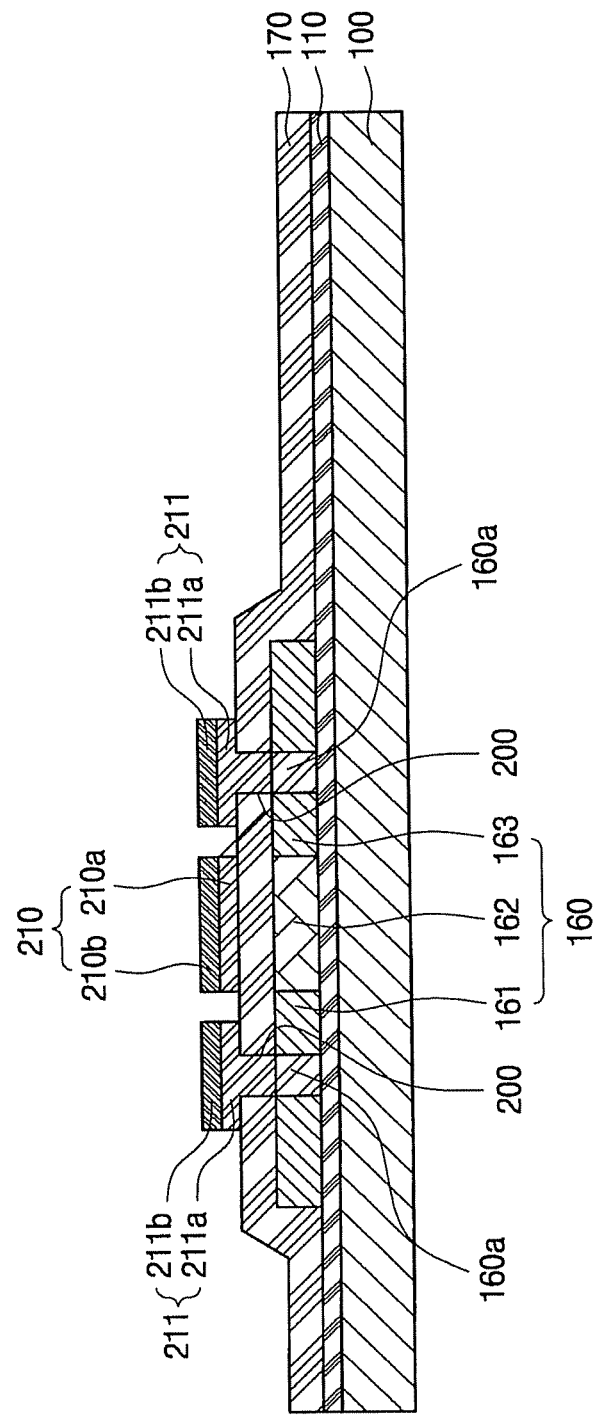

Referring to FIG. 2C, the photoresist pattern 180 is removed, and the gate insulating layer 170 is etched, thereby forming first holes 200 to partially expose regions of the semiconductor layer 160 other than the channel region 162.

Thereafter, a gate electrode material is deposited on the entire surface of the substrate 100 and patterned, thereby forming a gate electrode 210 and at least one metal structure 211 comprising a metal, a metal silicide or a combination or double layer of a metal and metal silicide at the same time. Herein, the term "metal structure" refers to a structure that includes a metal, a metal silicide or a combination or double layer of a metal and metal silicide. Each metal structure 211 contacts the exposed region of the semiconductor layer through one of the first holes 200 and is spaced apart from the gate electrode 210. Each metal structure 211 is disposed in one of the first holes 200 and may or may not protrude from the surface of the gate insulating layer 170. It is to be understood that the number of holes 200 and metal structures 211 may be fewer than or greater than what is shown in FIG. 2C.

The metal structure 211 is formed of a metal having a lower diffusion coefficient than the crystallization-inducing metal in the semiconductor layer 160 or an alloy thereof or a metal silicide layer formed of a silicide of the metal. The metal or metal silicide used to form the metal structure 211 may be a gettering metal or metal silicide.

More specifically, the metal or metal silicide used for forming the metal structure 211 may have a diffusion coefficient in the semiconductor layer 160 that is 1/100 or less than the diffusion coefficient of the crystallization-inducing metal. When the metal or metal silicide has a diffusion coefficient that is 1/100 or less than of the of the crystallization-inducing metal, the metal or metal silicide may be prevented from departing from the adjoining region 160a of the semiconductor layer 160 that corresponds to metal structure, and from diffusing into the other region of the semiconductor layer 160.

Nickel (Ni) is widely used as the crystallization-inducing metal for the crystallization of the semiconductor layer 160. Since Ni has a diffusion coefficient of about $10^{-5}$ cm$^2$/s or less in the semiconductor layer 160, when Ni is used as the crystallization-inducing metal, the metal structure 211 used in the gettering process may be formed of a metal or metal silicide having a diffusion coefficient that is 1/100 or less than the diffusion coefficient of Ni in the semiconductor layer 160, that is, a metal or metal silicide having a diffusion coefficient of about 0 to $10^{-7}$ cm$^2$/s. More specifically, the metal structure 211 may be formed of a metal or metal silicide having a diffusion coefficient of about 0 to $10^{-7}$ cm$^2$/s at a temperature of about 500 to 993° C. When the metal structure 211 is formed of a metal or metal silicide having a diffusion coefficient of about 0 to $10^{-7}$ cm$^2$/s, the metal or metal silicide may be prevented from diffusing into the channel region 162 of the semiconductor layer 160.

The gate electrode 210 and the metal structure 211 may be formed of one selected from the group consisting of Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, TiN, TaN, an alloy thereof, and a silicide of the metal.

The gate electrode 210 and the metal structure 211 may be formed as a single layer or a multiple layer. The single layer may be formed of one selected from the group consisting of Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, TiN, TaN, an alloy thereof, and a silicide of the metal. The multiple layer may include lower layers 210a and 211a, which are formed by depositing the material described above for the single layer, and upper layers 210b and 211b, which are formed of Al or an Al—Nd alloy. When the upper layers 210b and 211b formed of Al or an Al—Nd alloy are formed, the gate electrode 210 may have a low resistance, since Al or the Al—Nd alloy has a low resistance.

The metal structure 211 may be formed in a region that is spaced 50 μm or less from the channel region 162 of the semiconductor layer 160. When the metal structure 211 is formed in a region that is spaced more than 50 μm from the channel region 162 of the semiconductor layer 160, the distance from the channel region 162 to the adjoining region 160a of the semiconductor layer 162 that corresponds to metal structure 211 becomes so great that an annealing time taken to getter the crystallization-inducing metal from the channel region 162 to the adjoining region 160a of the semiconductor layer 162 that corresponds to metal structure 211 may be increased, which may cause the deformation of the substrate 100 or to prevent the crystallization-inducing metal from reaching the adjoining region 160a.

The metal structure 211 may be formed to a thickness of about 30 to 10000 Å. When the metal structure 211 is formed to a thickness of less than 30 Å, the crystallization-inducing metal may not be effectively gettered into the region 160a of the semiconductor layer 160 corresponding to the metal layer, the metal silicide layer, or the double layer thereof 211. When the metal layer, the metal silicide layer, or the double layer thereof 211 is formed to a thickness of more than 10000 Å, the metal structure 211 may peel due to stress.

Figure 2D:
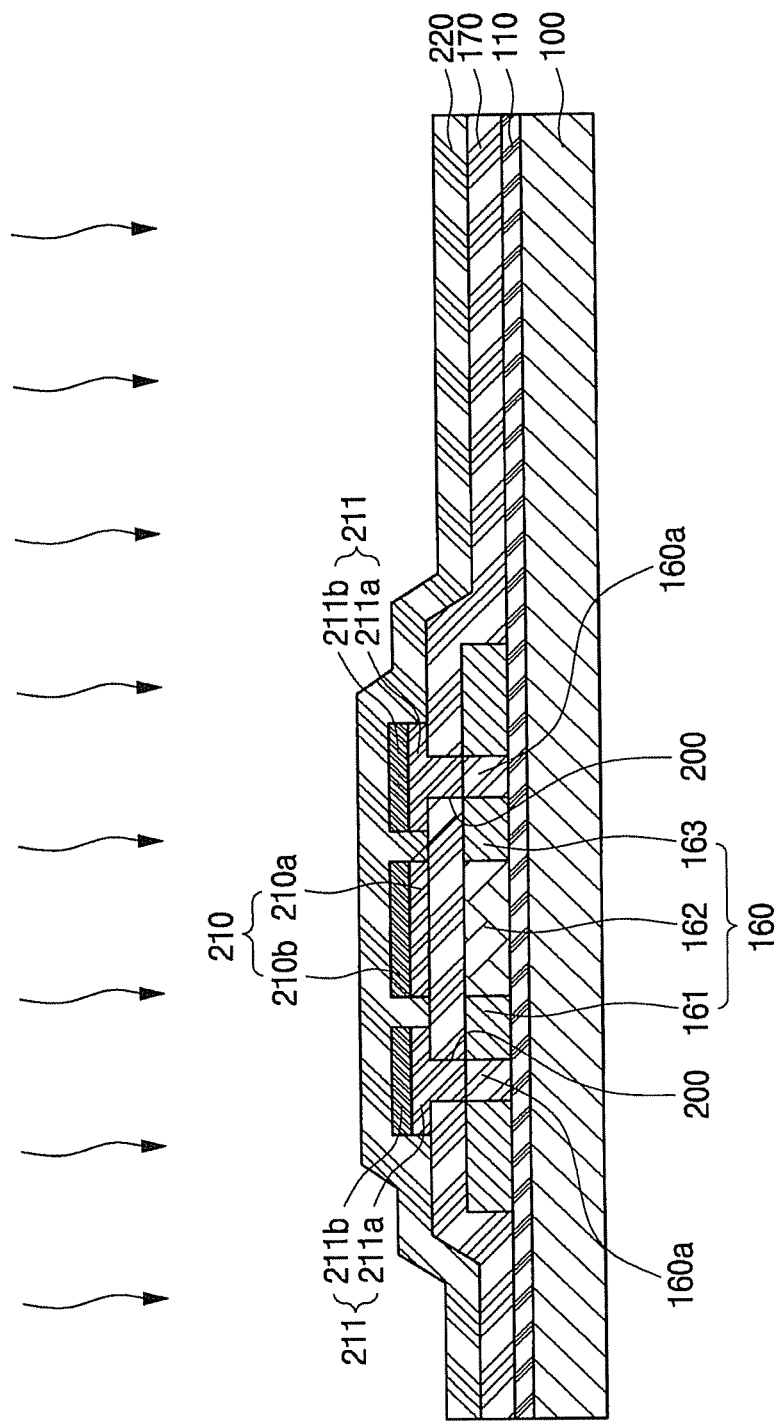

Referring to FIG. 2D, an interlayer insulating layer 220 is formed on the entire surface of the substrate 100 to protect and electrically insulate the underlying structure. The interlayer insulating layer 220 may be a silicon oxide layer, a silicon nitride layer, or a double layer thereof.

Subsequently, in order to remove the crystallization-inducing metal from the semiconductor layer 160, or more specifically, from the channel region 162 of the semiconductor layer 160, an annealing process is performed. As a result, the metal of the metal structure 211 combines with silicon of the semiconductor layer 160 to form a metal silicide in the surface of the semiconductor layer 160 that contacts the metal structure 211, or the metal silicide of the metal structure diffuses into the surface of the semiconductor layer 160. Thus, a metal silicide made up of a metal different from the crystallization-inducing metal is formed to a predetermined depth from the surface of the semiconductor layer 160 in the adjoining region 160a of the semiconductor layer 160 that contacts the metal structure 211. A portion of the metal structure 211 that contacts the semiconductor layer 160 may turn into a metal silicide layer.

When the crystallization-inducing metal (e.g., Ni) remaining in the channel region 162 of the semiconductor layer 160 is diffused into the adjoining region 160a of the semiconductor layer 160 corresponding to metal structure 211 due to the annealing process, the crystallization-inducing metal is precipitated in the region 160a and is not diffused any more. This is because the crystallization-inducing metal (e.g., Ni) for crystallization is thermodynamically more stable in the adjoining region 160a containing the metal silicide than in the rest of the semiconductor layer 160. On the above-described principle, the crystallization-inducing metal for crystallization may be removed from the channel region 162 of the semiconductor layer 160.

The annealing process may be performed at a temperature of about 500 to 993° C. for 10 seconds to 10 hours. When the annealing process is performed at a temperature lower than 500° C., the crystallization-inducing metal (e.g., Ni) is not diffused in the semiconductor layer 160 so that the crystallization-inducing metal may not move to the adjoining region 160a of the semiconductor layer 160. When the annealing process is performed at a temperature higher than 993° C., Ni for the crystallization-inducing metal may be in a solid phase because the eutectic point of Ni for the crystallization-inducing metal is 993° C., and the substrate 100 may be deformed due to a high temperature.

When the annealing process is performed for a shorter time than 10 seconds, it may be difficult to sufficiently remove the crystallization-inducing metal (e.g., Ni) from the channel region 162 of the semiconductor layer 160. When the annealing process is performed for a longer time than 10 hours, the substrate 100 may be deformed due to a long-duration annealing process, problems may be caused in terms of fabrication cost and yield. When the annealing process is performed at a relatively high temperature, it is possible to remove the crystallization-inducing metal in a relatively short amount of time.

As an alternative, the annealing process may be performed any other time after the metal structure 211 is formed. For example, when the annealing process is performed after an insulating layer is formed on the gate electrode 210, the gate electrode 210 may prevent thermal damage caused by the annealing process. Also, the annealing process may be performed in an inert atmosphere in order to protect the gate electrode 210.

Figure 2E:
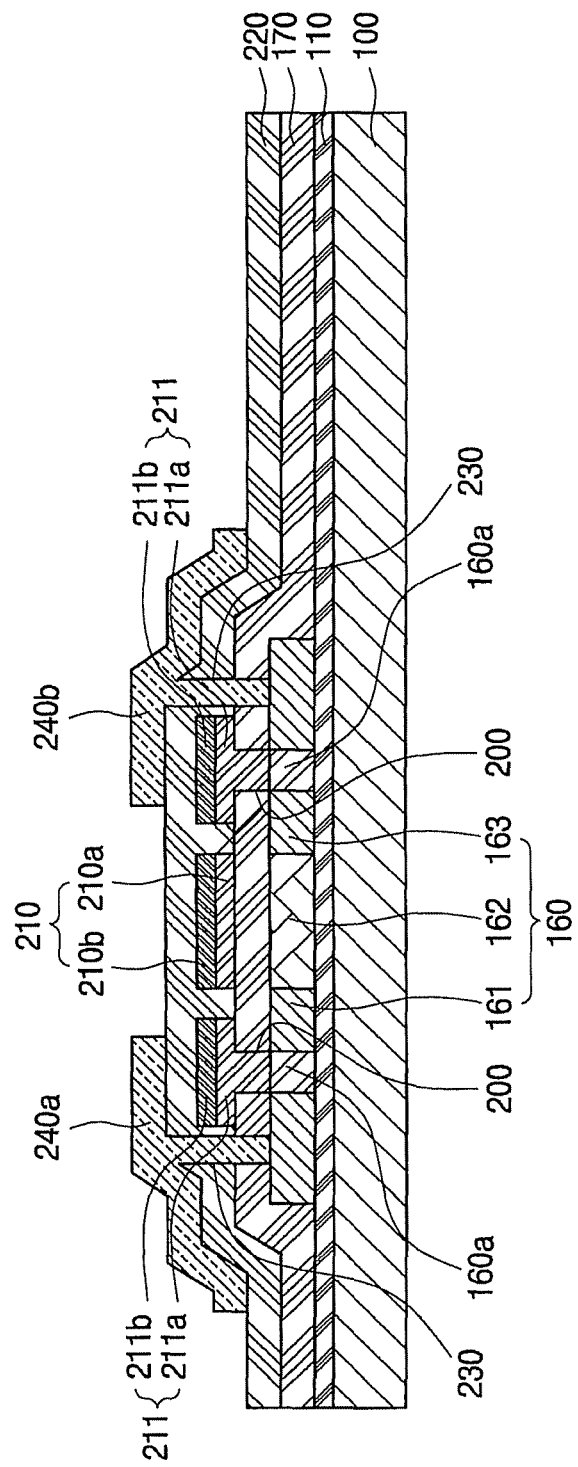

Referring to FIG. 2E, the gate insulating layer 170 and the interlayer insulating layer 220 may be etched, thereby forming contact holes 230 to expose the source and drain regions 161 and 163 of the semiconductor layer 160.

Thereafter, a source/drain electrode material is deposited on the entire surface of the substrate 100 and patterned, thereby forming source and drain electrodes 240a and 240b. The source and drain electrodes 240a and 240b are electrically connected to the source and drain regions 161 and 163 of the semiconductor layer 160 through the contact holes 230, respectively. The source and drain electrodes 240a and 240b may be formed of one selected from the group consisting of molybdenum (Mo), chrome (Cr), tungsten (W), molybdenum-tungsten (MoW), aluminum (Al), aluminum-neodymium (Al—Nd), titanium (Ti), titanium nitride (TiN), copper (Cu), an Mo alloy, an Al alloy, and a Cu alloy.

Figure 2F:
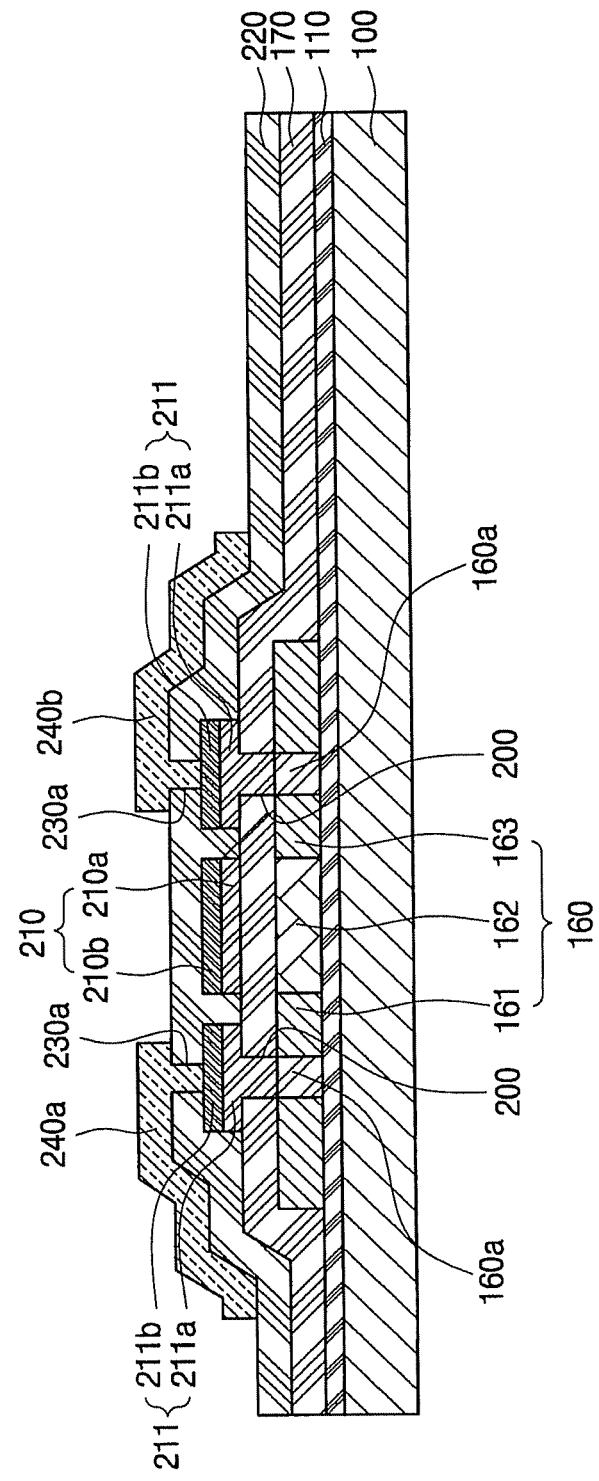

Alternatively, referring to FIG. 2F, the interlayer insulating layer 220 may be etched to form contact holes 230a that expose the metal structure 211. In this case, there may be two metal structures 211 electrically connected to the source and drain region 161 and 163, respectively, of the semiconductor layer 160 through the first holes 200, and the source and drain electrodes 240a and 240b may be electrically connected to the metal structures 211 through the contact holes 230a, so that the source and drain electrodes 240a and 240b may be electrically connected to the source and drain regions 161 and 163 of the semiconductor layer 160.

As a consequence, the fabrication of the top-gate TFT according to the embodiment of FIG. 2F is completed.

Figure 3A:
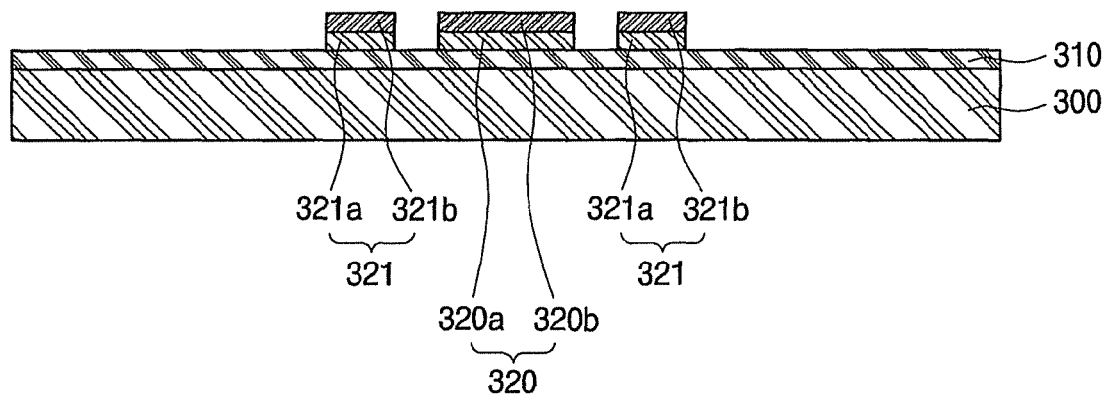
FIGS. 3A through 3C are cross-sectional views illustrating a method of fabricating a bottom-gate TFT according to an exemplary embodiment of the present invention.
Figure 3B:
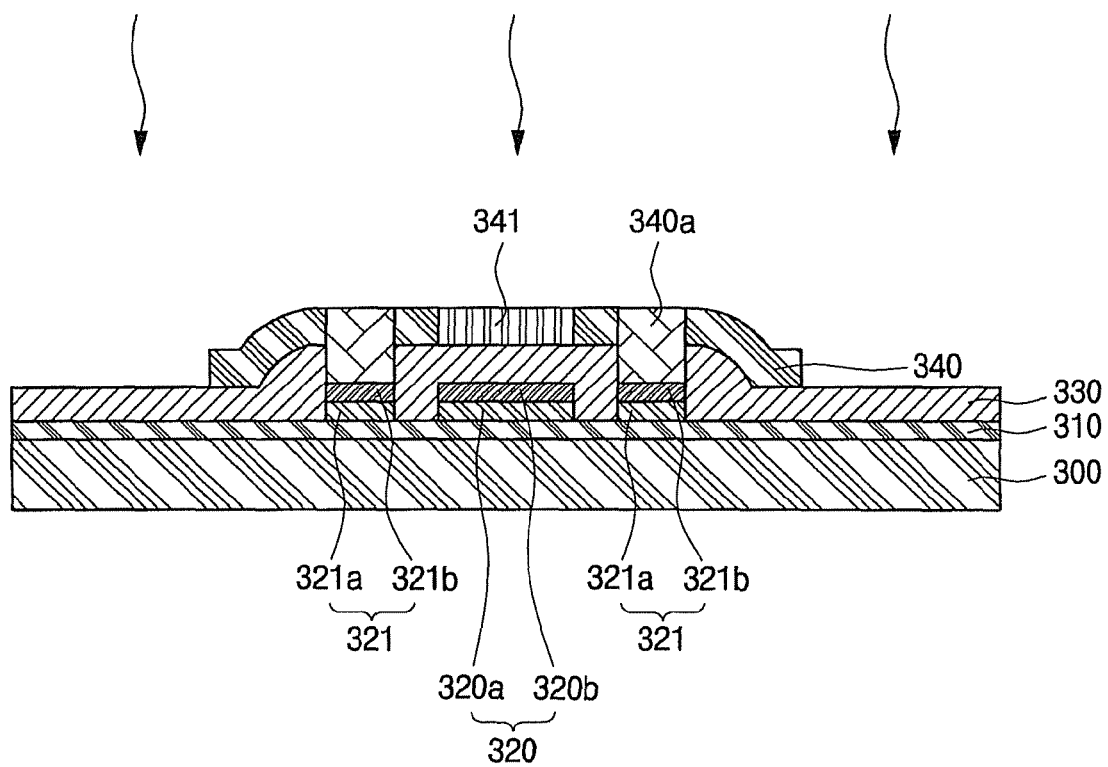
Figure 3C:
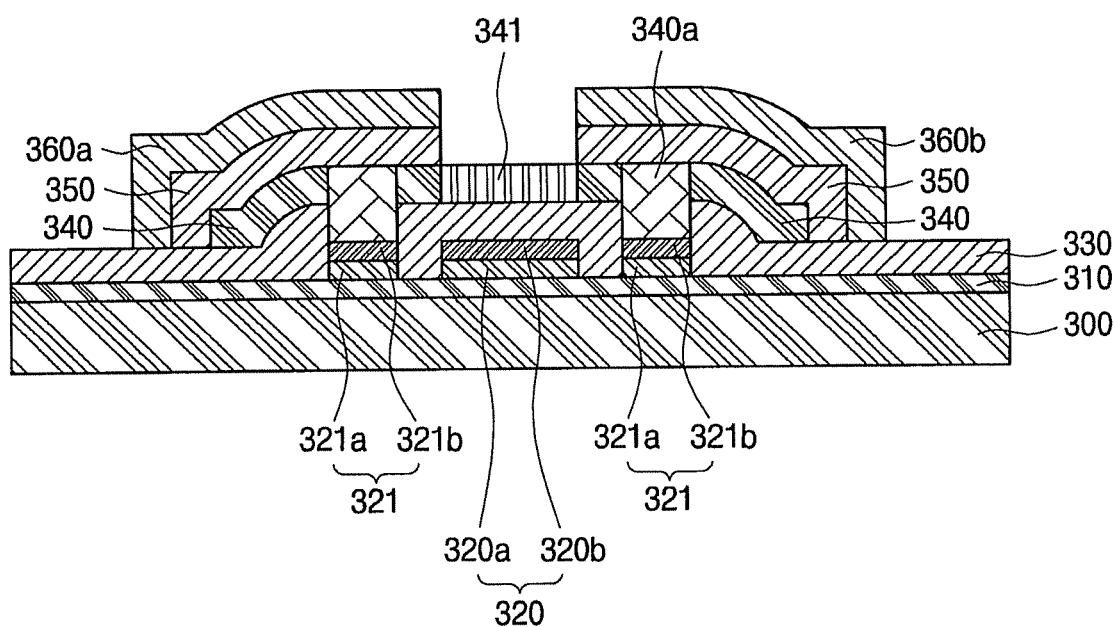

FIGS. 3A through 3C are cross-sectional views illustrating a method of fabricating a bottom-gate TFT according to another embodiment of the present invention. The method of fabricating the bottom-gate TFT will now be described with reference to the method shown in FIGS. 2A through 2F except for particulars mentioned below.

Referring to FIG. 3A, a buffer layer 310 is formed on a substrate 300. A gate electrode material is deposited on the buffer layer 310 and patterned, thereby forming a gate electrode 320 and at least one metal structure 321 at the same time. Here also, the term "metal structure" refers to a structure that includes a metal, a metal silicide or a combination or double layer of a metal and metal silicide. The metal structure 321 may be formed apart from the gate electrode 320 under the semiconductor layer 340 (refer to FIG. 3B) in a position corresponding to a region of a semiconductor layer 340 other than a channel region. Although two metal structures 321 are shown in FIG. 3A, it is to be understood that the number of metal structures can be greater than or less than what is shown.

The metal structure 321 may comprise a metal having a lower diffusion coefficient than a crystallization-inducing metal in the semiconductor layer 340 or an alloy thereof or a metal silicide layer formed of a silicide of the metal. The metal or metal silicide used to form the metal structure 321 may be a gettering metal or metal silicide.

The metal structure 321 may be formed of one selected from the group consisting of Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, TiN, TaN, an alloy thereof, and a silicide of the metal.

The gate electrode 320 and metal structure 321 may be formed as a single layer or as a multiple layer. The single layer may be formed of one selected from the group consisting of Sc, Ti, Zr, Hf, V, Nb, Ta, Cr, Mo, W, Mn, Re, Ru, Os, Co, Rh, Ir, Pt, Y, Ta, La, Ce, Pr, Nd, Dy, Ho, TiN, TaN, an alloy thereof, and a silicide of the metal. The multiple layer may include lower layers 320a and 321a, which are formed by depositing the material described above for the single layer, and upper layers 320b and 321b, which are formed of Al or an Al—Nd alloy. When the upper layers 320b and 321b formed of Al or an Al—Nd alloy are formed, the gate electrode 320 may have a low resistance, since Al or an Al—Nd alloy has a low resistance.

The metal structure 321 may be formed in a region that is spaced 50 μm or less from a channel region of the semiconductor layer 340. When the metal structure 321 is formed in a region that is spaced more than 50 μm from the channel region of the semiconductor layer 340, the distance from the channel region to the adjoining region 340a of the semiconductor layer 162 that corresponds to the metal structure 321 becomes so great that an annealing time taken to getter the crystallization-inducing metal from the channel region to the adjoining region 340a of the semiconductor layer 162 that corresponds to the metal structure 321 may be increased, thereby causing the deformation of the substrate 300 or the crystallization-inducing metal may not reach the adjoining region 340a.

The metal structure 321 may be formed to a thickness of about 30 to 10000 Å. When the metal structure 321 is formed to a thickness of less than 30 Å, the crystallization-inducing metal may not be effectively gettered into the adjoining region 340a of the semiconductor layer 340 corresponding to the metal structure 321. When the metal structure 321 is formed to a thickness of more than 10000 Å, the metal structure 321 may peel due to stress.

Referring to FIG. 3B, a gate insulating layer 330 is formed on the substrate 300 having the gate electrode 320 and metal structure 321. During the formation of the gate insulating layer 330, a gate insulating layer material is removed from a top surface of the metal structure 321 in order to allow the metal structure 321 to directly contact a poly-Si layer that will be formed later.

Thereafter, an a-Si layer is formed on the gate insulating layer 330 and crystallized into a poly-Si layer using the same SGS crystallization method as described with reference to FIGS. 1A through 1D. The poly-Si layer is patterned to form the semiconductor layer 340. As an alternative, the poly-Si layer may be patterned in a subsequent process. Meanwhile, during an annealing process for crystallizing the a-Si layer, a crystallization-inducing metal may be gettered into the adjoining region 340a of the semiconductor layer 340 corresponding to the metal structure 321.

Thereafter, an annealing process may be performed on the substrate 300 having the buffer layer 310, the gate electrode 320, metal structure 321, the gate insulating layer 330, and the semiconductor layer 340. The annealing process may be performed in order to getter the crystallization-inducing metal from the semiconductor layer 340, particularly, a channel region 341 of the semiconductor layer 340, into the adjoining region 340a of the semiconductor layer 340 corresponding to the metal structure 321. Alternatively, the annealing process may be performed any other time after the metal structure 321 is formed.

Referring to FIG. 3C, an ohmic contact material layer and a source/drain conductive layer are sequentially formed on the semiconductor layer 340 and sequentially patterned, thereby forming an ohmic contact layer 350 and source and drain electrodes 360a and 360b. The ohmic contact layer 350 may be a doped a-Si layer.

In order to reduce the number of mask processes, the source/drain conductive layer and the ohmic contact material layer may be patterned using a single mask. As a result, the ohmic contact layer 350 may be disposed under the entire source and drain electrodes 360a and 360b. The ohmic contact layer 350 may be interposed between the semiconductor layer 340 and the source and drain electrodes 360a and 360b so that the source and drain electrodes 360a and 360b may be in ohmic contact with the semiconductor layer 340. Alternatively, the formation of the ohmic contact layer 350 may be omitted. In this case, before the source/drain conductive layer is stacked, a conductive region may be formed on the semiconductor layer 340 so that the source and drain electrodes 360a and 360b may be in ohmic contact with the semiconductor layer 340. As a consequence, the fabrication of the bottom-gate TFT having the gate electrode 320, the semiconductor layer 340, and the source and drain electrodes 360a and 360b is completed.

Figure 4:
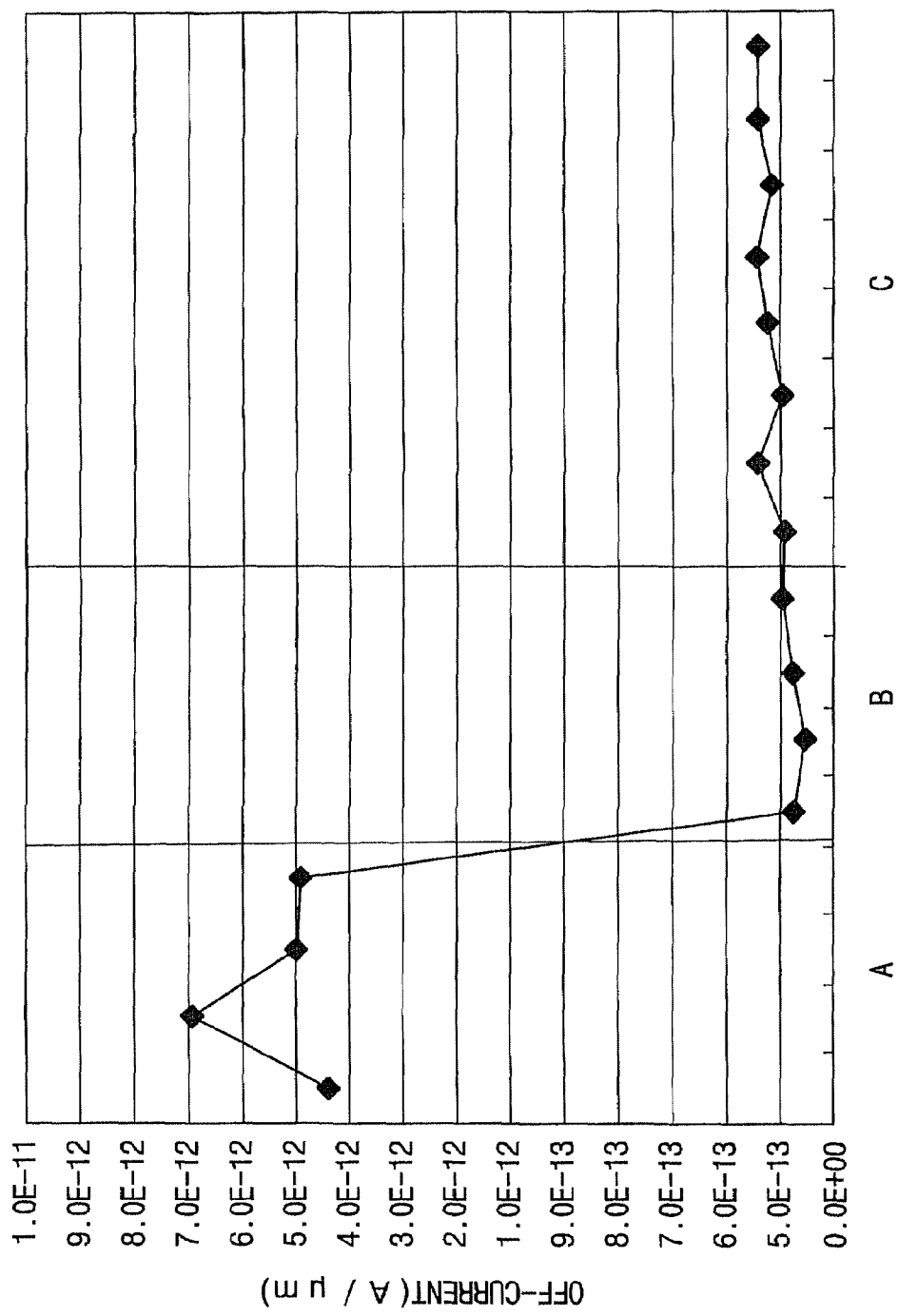
FIG. 4 is a graph showing a comparison of an off-current per unit width of a semiconductor layer of a TFT according to an exemplary embodiment of the present invention and an off-current per unit width of a semiconductor layer of a conventional TFT fabricated by a gettering process using P doping.

FIG. 4 is a graph showing a comparison of off-current values per unit width of a semiconductor layer of a TFT according to embodiments of the present invention and off-current values per unit width of a semiconductor layer of a conventional TFT fabricated by a gettering process using phosphorus (P) doping.

In the abscissa of the graph, a region A refers to a conventional TFT fabricated by a gettering process using P doping, and regions B and C refer to TFTs according to embodiments of the present invention. Specifically, the region B is a TFT fabricated using titanium (Ti) as the metal structure, and the region C is a TFT fabricated using molybdenum (Mo) as the metal structure. The ordinate of the graph denotes off-current (A/μm) values per unit width of a semiconductor layer of each of the TFTs.

In forming the conventional TFT, the gettering process included doping P ions into a region of a crystallized semiconductor layer other than a channel region at a dose of about $2 \times e^{14}/cm^2$ and annealing a substrate having the doped semiconductor layer at a temperature of about 550° C. for 1 hour. In forming the TFTs according to the embodiments of the present invention, either a Ti layer or a Mo layer was deposited to a thickness of about 100 Å over the region of the semiconductor layer other than a channel region to be spaced apart from a gate electrode. A gettering process was performed by annealing under the same conditions as the above-described gettering process using P doping. After the annealing process, an off-current of each of the TFTs was measured.

When the Ti layer or the Mo layer was deposited and the annealing process was performed to provide gettering according to aspects of the present invention, Ti or Mo reacted with Si of the semiconductor layer to form a Ti silicide or a Mo silicide. The Ti silicide or Mo silicide was formed in a lower region of the semiconductor layer that contacts the Ti layer or Mo layer, and a crystallization-inducing metal was gettered into the region where the Ti silicide or Mo silicide was formed.

Referring to the region A of FIG. 4, in the TFT formed by a process including a gettering process using P doping, the off-current per unit width of the semiconductor layer of the TFT was about 4.5E-12 to 7.0E-12 A/μm. However, referring to the regions B and C of FIG. 4, the off-current per unit width of the semiconductor layer of the TFT formed by a process including gettering using the Ti layer (region B) was about 5.0E-13 A/μm or less, and the off-current per unit width of the semiconductor layer of the TFT formed by a process including gettering using the Mo layer (region C) was about 6.0E-13 A/μm or less. Therefore, it can be observed that the off-current per unit width of the semiconductor of the TFT according to the embodiments of the present invention was far smaller than that of the conventional TFT.

Based on the above-described results, it can be concluded that the amount of a crystallization-inducing metal remaining in the channel region of the semiconductor layer was greatly reduced in the TFTs preparing according to embodiments of the present invention. Therefore, according to the embodiments of the present invention, a TFT having reduced leakage current and good electrical properties can be fabricated.

Hereinafter, an organic light emitting display (OLED) display device having a TFT according to another embodiment of the present invention will be described with reference to FIG. 5.

Figure 5:
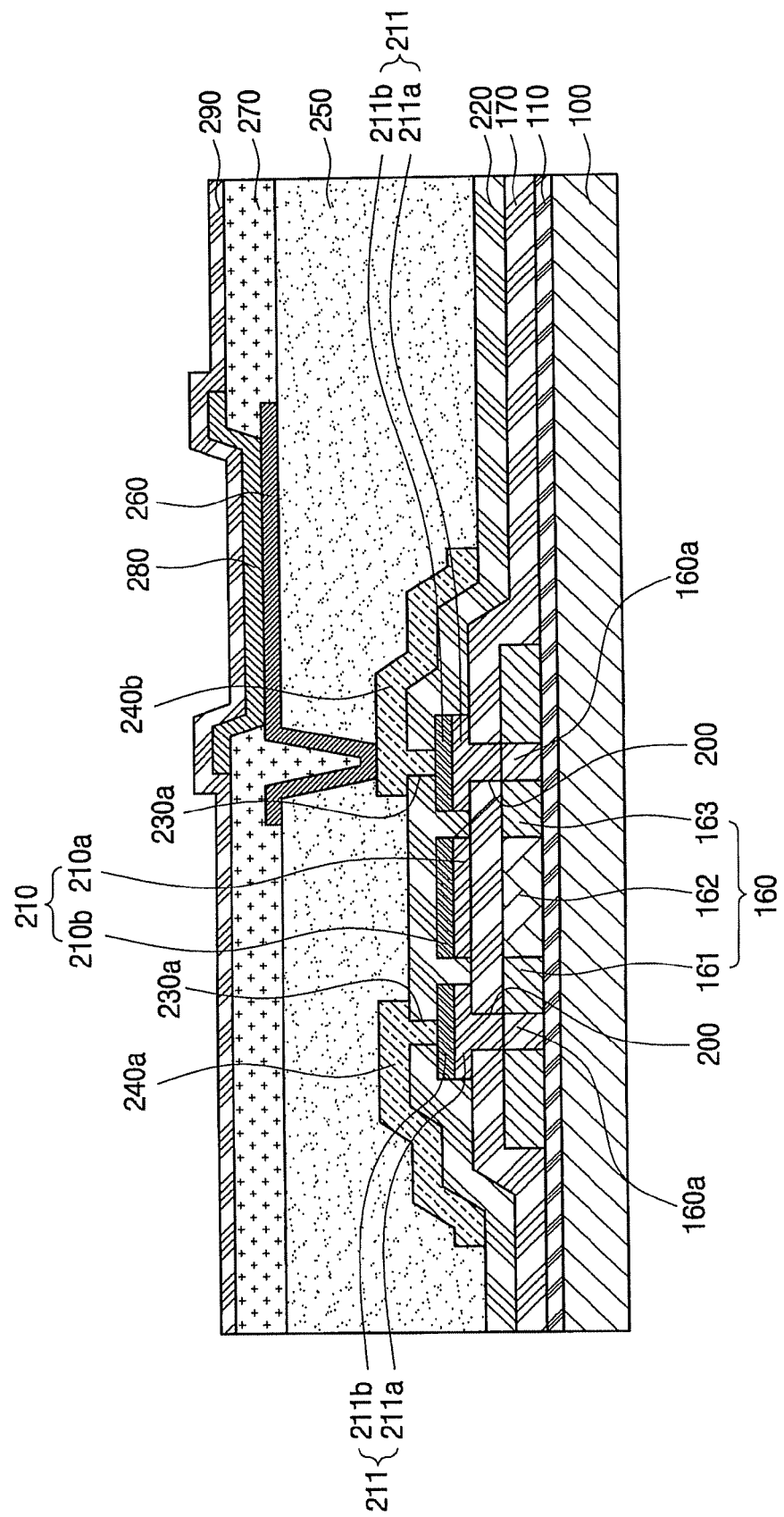
FIG. 5 is a cross-sectional view of an organic light emitting diode (OLED) display device having a TFT according to an exemplary embodiment of the present invention.

Referring to FIG. 5, an insulating layer 250 is formed on the entire surface of the substrate 100 having the TFT shown in FIG. 2F. The insulating layer 250 may be an inorganic layer or an organic layer. The inorganic layer may be a silicon oxide layer, a silicon nitride layer, or a silicon on glass (SOG) layer. The organic layer may be formed of one selected from the group consisting of polyimide, benzocyclobutene series resin, and acrylate. Alternatively, the insulating layer 250 may be a stack structure of the inorganic layer and the organic layer.

The insulating layer 250 may be etched, thereby forming a via hole exposing one of the source and drain electrodes 240a and 240b. A first electrode 260 is formed to be connected to one of the source and drain electrodes 240a and 240b through the via hole. The first electrode 260 may be an anode or a cathode. When the first electrode 260 is an anode, the anode may be formed of a transparent conductive material selected from the group consisting of indium tin oxide (ITO), indium zinc oxide (IZO), and indium tin zinc oxide (ITZO). When the first electrode 260 is a cathode, the cathode may be formed of one selected from the group consisting of Mg, Ca, Al, Ag, Ba, and an alloy thereof.

Thereafter, a pixel defining layer 270 is formed on the first electrode 260 having an opening partially exposing the surface of the first electrode 260, and an organic layer 280 having an emission layer (EML) is formed on the exposed surface of the first electrode 260. The organic layer 280 may further include at least one selected from the group consisting of a hole injection layer (HIL), a hole transport layer (HTL), a hole blocking layer (HBL), an electron blocking layer (EBL), an electron injection layer (EIL), and an electron transport layer (ETL). Subsequently, a second electrode 290 is formed on the organic layer 280. Thus, the fabrication of the OLED display device according to the present embodiment is completed.

As described above, a metal structure is formed over or under a semiconductor layer, which is crystallized using a crystallization-inducing metal, in a predetermined region corresponding to a region of the semiconductor layer other than a channel region. The metal structure is formed of a metal having a lower diffusion coefficient than the crystallization-inducing metal in the semiconductor layer, an alloy thereof, or a silicide of the metal. Thereafter, a substrate having the metal structure is annealed, thereby removing the remaining crystallization-inducing metal from the channel region of the semiconductor layer. As a result, the off-current of the TFT can be markedly reduced.

Furthermore, the metal structure can be formed of the same material as the gate electrode, thereby simplifying the fabrication process.

According to aspects of the present invention, the remaining crystallization-inducing metal is removed from a channel region of a semiconductor layer so that a TFT having excellent electrical properties and an OLED display device having the TFT can be fabricated.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor (TFT) comprising:
   a substrate;
   a semiconductor layer disposed on the substrate and including a channel region and source and drain regions;
   a gate electrode disposed in a position corresponding to the channel region of the semiconductor layer;
   a gate insulating layer interposed between the gate electrode and the semiconductor layer to electrically insulate the semiconductor layer from the gate electrode;
   a metal structure comprising a double layer disposed apart from the gate electrode, over the semiconductor layer, and contacting a surface of a region of the semiconductor layer other than the channel region through a hole in the gate insulating layer, the metal structure consisting of a same material as the gate electrode; and
   source and drain electrodes electrically connected to the source and drain regions, respectively, of the semiconductor layer,
   wherein an insulating layer is disposed between the metal structure and the source and drain electrodes, and
   wherein the metal structure is not directly connected to the source and drain electrodes.

2. The TFT according to claim 1, wherein the metal structure is disposed at a distance of 50 μm or less from the channel region of the semiconductor layer.

3. The TFT according to claim 1, wherein the metal structure has a thickness of about 30 to 10000 Å.

4. The TFT according to claim 1, wherein the metal structure and the gate electrode include a multiple layer formed by stacking an Al layer or an Al—Nd alloy layer and a layer formed of one selected from the group consisting of Sc, Ti, Zr, Hf, V, Nb, Ta, Cr, Mo, W, Mn, Re, Ru, Os, Co, Rh, Ir, Pt, Y, La, Ce, Pr, Nd, Dy, Ho, TiN, TaN, an alloy thereof, and a silicide thereof.

5. The TFT according to claim 1, wherein the insulating layer is disposed on the gate insulating layer.

6. The TFT according to claim 1, wherein the metal structure and the gate electrode include a metal layer formed of a metal or an alloy thereof or a metal silicide layer formed of a silicide of the metal having a lower diffusion coefficient than a crystallization-inducing metal in the semiconductor layer.

7. The TFT according to claim 6, wherein the metal layer or the metal silicide layer has a diffusion coefficient that is 1/100 or lower of the diffusion coefficient of the crystallization-inducing metal.

8. The TFT according to claim 7, wherein the crystallization-inducing metal is nickel (Ni), and the metal layer or the metal silicide layer has a diffusion coefficient of about 0 to $10^{-7}$ cm$^2$/s.

9. The TFT according to claim 7, wherein the metal layer or the metal silicide layer is formed of one selected from the group consisting of Sc, Zr, Hf, V, Nb, Ta, W, Mn, Re, Os, Ir, Y, La, Ce, Pr, Nd, Dy, Ho, an alloy thereof, and a silicide of the metal.

10. An organic light emitting diode (OLED) display device comprising:
   a substrate;
   a semiconductor layer disposed on the substrate and including a channel region and source and drain regions;
   a gate electrode disposed in a position corresponding to the channel region of the semiconductor layer;
   a gate insulating layer interposed between the gate electrode and the semiconductor layer to electrically insulate the semiconductor layer from the gate electrode;
   a metal structure comprising a double layer disposed apart from the gate electrode and over the semiconductor layer in a position corresponding to a region of the semiconductor layer other than the channel region, the metal structure consisting of a same material as the gate electrode;
source and drain electrodes electrically connected to the source and drain regions, respectively, of the semiconductor layer;
a first electrode electrically connected to one of the source and drain electrodes;
an organic layer disposed on the first electrode; and
a second electrode disposed on the organic layer,
wherein the metal structure contacts a surface of the semiconductor layer in the region of the semiconductor layer other than the channel region through a hole in the gate insulating layer,
wherein an insulating layer is disposed between the metal structure and the source and drain electrodes, and
wherein the metal structure is directly connected to the source and drain electrodes.

11. The OLED display device according to claim 10, wherein the insulating layer is disposed on the gate insulating layer.

* * * * *